United States Patent
Yamazaki et al.

[11] Patent Number: 6,136,091
[45] Date of Patent: Oct. 24, 2000

[54] PROCESS AND APPARATUS FOR PRODUCING POLYCRYSTALLINE SEMICONDUCTOR INGOT

[75] Inventors: Motoharu Yamazaki, Osaka; Tetsuhiro Okuno, Nara, both of Japan

[73] Assignee: Sharp Kabushiki Kaisha, Osaka, Japan

[21] Appl. No.: 09/102,373

[22] Filed: Jun. 23, 1998

[30] Foreign Application Priority Data

Jun. 23, 1997 [JP] Japan ...................... 9-166289

[51] Int. Cl.$^7$ .................................................. C30B 13/20
[52] U.S. Cl. .................................................. 117/81; 117/83
[58] Field of Search ........................ 23/301; 117/81, 117/83

[56] References Cited

U.S. PATENT DOCUMENTS

| | | |
|---|---|---|
| 3,898,051 | 8/1975 | Schmid . |
| 4,175,610 | 11/1979 | Zaubar et al. . |
| 4,218,418 | 8/1980 | Schmid et al. . |
| 4,738,831 | 4/1988 | Naumann et al. . |
| 5,714,004 | 2/1998 | Okuno . |
| 5,849,080 | 12/1998 | Okuno ...................... 117/222 |

FOREIGN PATENT DOCUMENTS

| | | |
|---|---|---|
| 0748884 | 12/1996 | European Pat. Off. . |
| 2500768 | 9/1982 | France . |
| 2509638 | 1/1983 | France . |
| 4236827 | 5/1994 | Germany . |
| 57-21515B2 | 5/1982 | Japan . |
| 58-54115B2 | 12/1983 | Japan . |
| 62-260710 | 11/1987 | Japan . |
| 2207062 | 1/1989 | United Kingdom . |

OTHER PUBLICATIONS

Kaneko, *Japan J. Applied Physics*, vol. 64.7, pp. 682–685 (1995) (with English translation).

Minster et al: "Molding and directional solidification of solar cell grade silicon using an insulating molten salt", Journal of Crystal Growth, vol. 82, No. 1–2, Mar. 1, 1987, pp. 155–161, XP002078236.

Prakash et al.: "Use of silicon oxynitride as a graphite mold releasing coating for the growth of shaped multicrystalline silicon crystals", Journal of Crystal Growth, vol. 144, No. ½, Nov. 1994, pp. 41–47, XP000484426.

*Primary Examiner*—Felisa Hiteshew
*Attorney, Agent, or Firm*—Birch, Stewart Kolasch & Birch, LLP

[57] ABSTRACT

A silicon semiconductor material is charged in a double-structured crucible of an outer crucible and an inner crucible. The crucible is heated from the upper side thereof by the heat radiated from a heating member energized by an induction heating coil, so that the silicon raw semiconductor material is melted. The bottom of the crucible is mounted on a supporting bed cooled by cooling water supplied from a cooling medium tank. The silicon semiconductor material is melted in the inner crucible and starts solidifying from the bottom portion thereof. The silicon semiconductor material expands in volume at the time of solidification. Since a gap is formed between the inner crucible and the outer crucible, however, the outward extension of the inner crucible with the silicon semiconductor material alleviates a strain generated at the time of solidification, thereby producing an excellent polycrystalline semiconductor ingot. As a result, the strain in the polycrystalline semiconductor ingot produced by the unidirectional solidification process is reduced to improve the quality.

5 Claims, 8 Drawing Sheets

PROCESS AND APPARATUS FOR PRODUCING POLYCRYSTALLINE SEMICONDUCTOR INGOT

BACKGROUND OF THE INVENTION

1. Field of the Invention

The present invention relates to a process and an apparatus capable of producing a polycrystalline semiconductor ingot of material such as silicon with less strain.

2. Description of the Related Art

A polycrystalline semiconductor of silicon or the like has received attention as a material for a solar cell or the like from the viewpoint of commercial production and resources. Most solar cells currently in use for solar power supply are silicon solar cells. The solar cell, however, still has the problem of high production cost. For utilizing this power source to a higher extent, it is necessary to further reduce the cost. Most recently, solar cells as power generators are based on single-crystal or amorphous silicon. So, further development of solar cells made of polycrystalline silicon is needed for cost reduction.

As a general process for producing a polycrystalline silicon semiconductor, conventionally solid silicon is charged in a crucible of silica (silicon dioxide $SiO_2$) or the like, and after melting the solid silicon by heating, the melted semiconductor material is cast into a graphite crucible. In Japanese Examined Patent Publication JP-B2 57-21515, for example, there is disclosed a prior art of a semi-continuous cast furnace developed by Wacker-Chemitronie GmbH in Germany, wherein silicon is melted in a vacuum or in an inert gas in a silicon crucible, and is then poured into a mold made of graphite or the like by inclining the crucible. In Japanese Examined Patent Publication JP-B2 8-54115, there is disclosed a prior art of a heat exchange method developed by Crystal Systems, inc. in the U.S., wherein silicon is melted in vacuum in a silica crucible, and is then solidified directly—as it is. In Japanese Unexamined Patent Publication JP-A 62-260710, there is disclosed an improvement of the Wacker process, wherein a water-cooled steel sheet is used as the silicon melting crucible.

In the production of polycrystalline silicon ingot, most cases adopt a method of growing crystals in a crucible. In this method, however, a semiconductor polycrystal is required to be grown in a closed space. When an expansion in volume occurs during the solidification of crystals, which causes a stress at a contacting part between the solidified semiconductor polycrystal and an inner wall of the crucible, and a strain due to the stress is left unremoved in a thus produced ingot. The strain left in the ingot adversely affects the quality and reduces the optical or electrical characteristics of the semiconductor. This deteriorates the power generation efficiency in such applications as a solar cell. Also, an increased stress will cause mechanical cracking.

SUMMARY OF THE INVENTION

The object of the present invention is to provide a process and an apparatus for producing a polycrystalline semiconductor ingot capable of producing a high quality polycrystalline semiconductor ingot.

In a first aspect of the invention, there is provided a process for producing a polycrystalline semiconductor ingot comprising the steps of:

charging a raw semiconductor material which will expand at the time of being solidified, into a crucible; and heating a top of the crucible while cooling a bottom of the same, thereby allowing the raw semiconductor material to be solidified uni-directionally from a lower part to an upper part thereof within the crucible, wherein the crucible used is capable of relaxing a strain caused by an expansion of the raw semiconductor material at the time of solidification.

According to the invention, a raw semiconductor material having been charged in a crucible is solidified uni-directionally from a lower part to an upper part thereof by heating the top of the crucible and cooling the bottom of the crucible, and at the time of solidification the semiconductor material volume is expanded. Since strain caused by the expansion can be relaxed by the crucible, a high quality polycrystalline semiconductor ingot with less strain can be produced.

In a second aspect of the invention, the process is characterized in that the crucible is formed to be a double-structured crucible in which a space is provided between an inner crucible and an outer crucible, and the inner crucible extends in accordance with the expansion of the semiconductor so as to relax the strain in the semiconductor.

According to the invention, a space is provided between the inner crucible and the outer crucible of the double-structured crucible, so that even when the raw semiconductor material expands to generate strain at the time of solidification, the strain is relaxed by the help of the inner crucible extending in accordance with the expansion of the semiconductor. Therefore, a high quality polycrystalline semiconductor ingot can be obtained.

In a third aspect of the invention, the process is characterized in that a partition is provided inside a peripheral wall of the crucible, and the partition is arranged to be movable outwardly.

According to the invention, the raw semiconductor material is melted and solidified in a space defined by the partition inside the peripheral wall of the crucible. The partition moves outwardly to absorb the expansion of the semiconductor material at the time of solidification to relax the stress, thus producing a high-quality polycrystalline semiconductor ingot.

In a fourth aspect of the invention, the process is characterized in that the crucible can be divided into a plurality of portions, and the portions of the crucible are combined with each other in the form of a comb at the bottom of the crucible so as to be slidably displaced outwardly in a comb tooth direction of the crucible.

According to the invention, since the crucible can be divided into a plurality of portions which are combined with each other in the form of a comb on the bottom of the crucible so as to be slidably displaced outwardly in a radial direction of the crucible, even if the raw semiconductor material melted within the crucible expands at the time of solidification, the portions of the crucible are displaced outwardly in the radial direction to relax the strain, thus producing a high quality polycrystalline semiconductor ingot.

In a fifth aspect of the invention, the process further comprises a step of placing semiconductor seed crystals on the bottom of the crucible before charging the raw semiconductor material, and is characterized in that a polycrystal is grown from the seed crystals.

According to the invention, since the polycrystalline semiconductor ingot is grown from the seed crystals placed on the bottom of the crucible, a strain caused by the expansion of the seed crystals during heating is relaxed by the crucible and the solidification is started in a condition with fewer strains, thus making it possible to produce a high-quality polycrystalline semiconductor ingot.

In a sixth aspect of the invention, the process is characterized in that the raw semiconductor material is a polysilicon.

According to the invention, a high-quality polycrystalline ingot solidified uni-directionally can be produced using an abundant silicon.

In a seventh aspect of the invention, there is provided an apparatus for producing a polycrystalline semiconductor ingot comprising:

an airtight vessel capable of keeping an interior thereof to be an inert environment;

a crucible located in the airtight vessel, into which a raw semiconductor material is to be charged;

heating means for heating a top of the crucible to melt the raw semiconductor material;

a supporting bed for mounting a bottom of the crucible thereon, capable of rotating and moving up and down; and cooling means for cooling the supporting bed, wherein the crucible is provided with a relaxing means for relaxing a strain caused by an expansion of the semiconductor at the time of solidification thereof.

According to the invention, a polycrystalline semiconductor ingot grown uni-directionally from a lower part to an upper part can be obtained by placing a crucible in an airtight vessel capable of maintaining an inert environment, charging a raw semiconductor material into the crucible, and heating the crucible from the top while cooling the crucible from the bottom. The strain caused by the expansion of the semiconductor at the time of solidification can be relaxed by the relaxing means included in the crucible, and therefore it is possible to produce a high-quality polycrystalline semiconductor ingot not substantially affected by the strain.

In an eighth aspect of the invention, the apparatus is characterized in that the crucible has a double structure as the relaxing means, and the double structure includes an outer crucible, an inner crucible, and a gap between the outer and inner crucibles.

According to the invention, since a gap is provided between the inner crucible and the outer crucible of the double-structured crucible, the inner crucible deforms in accordance with the expansion of the semiconductor at the time of solidification thereof to relax the strain caused by the expansion, thereby producing a high-quality polycrystalline semiconductor ingot.

In a ninth aspect of the invention, the apparatus is characterized in that the inner crucible is made of a metal material having a higher melting point than that of the raw semiconductor material and a poor wettability with the melted raw semiconductor material.

According to the invention, since the inner crucible is made of a metal material having a higher melting point than the raw semiconductor material, it is possible to store the melted raw semiconductor material and solidify the material uni-directionally from the lower part to the upper part. In addition, since the material of the crucible is poor in wettability with the melted raw semiconductor material, it is possible to push up the melted raw semiconductor material in the vicinity of an interface between a solid and a liquid during solidification of the raw semiconductor material. As a result of this, the expansion in volume at the time of solidification is absorbed, thereby producing a high-quality polycrystalline semiconductor ingot.

In a tenth aspect of the invention, the apparatus is characterized in that the inner crucible has a peripheral wall of a bent shape.

According to the invention, even if the raw semiconductor material in the inner crucible expands at the time of solidification, the peripheral wall of a bent shape is easily deformed to relax the strain, thereby producing a high-quality polycrystalline semiconductor ingot.

In an eleventh aspect of the invention, the apparatus is characterized in that the crucible has a partition inside the peripheral wall, which is outwardly movable.

According to the invention, since the raw semiconductor material is melted within a space defined by the partition and the partition is movable outwardly at the time of solidification of the semiconductor material, the strain caused by the expansion of the material is relaxed, thereby producing a high-quality polycrystalline semiconductor ingot.

In a twelfth aspect of the invention, the apparatus is characterized in that buffer means is provided between the crucible and the partition.

According to the invention, since moving of the partition with respect to the expansion of the semiconductor material at the time of solidification of the melted raw semiconductor material is adjusted by the buffer means, a high-quality polycrystalline semiconductor ingot can be produced without causing an abrupt change in stress. In addition, it is possible to place the seed crystals in a suitable position at the initial stages of the production.

In a thirteenth aspect of the invention, the apparatus is characterized in that the buffer means is a granulated refractory.

According to the invention, as a granulated refractory such as sand or quartz is arranged between the partition and the crucible as the buffer means, the movement of the partition is smoothly adjusted even in a high temperature environment conditions to relax the strain caused by the expansion of the raw semiconductor material at the time of solidification, thus producing a high-quality polycrystalline semiconductor ingot.

In a fourteenth aspect of the invention, the apparatus is characterized in that the crucible can be divided into a plurality of portions, and the portions of the crucible are combined with each other in the form of a comb at the bottom of the crucible so as to be slidably displaced outwardly in a radial direction of the crucible.

According to the invention, when the raw semiconductor material is solidified after having melted, the crucible is divided into a plurality of portions to absorb the expansion of the semiconductor and relax the strain, so that a high quality polycrystalline semiconductor ingot can be produced.

In a fifteenth aspect of the invention, the apparatus is characterized in that the crucible is made of carbon.

According to the invention, since the crucible is made of carbon, the portions which are combined in the form of comb at the bottom of the crucible are slidably displaced smoothly so that the expansion of the raw semiconductor material at the time of solidification can be relaxed.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
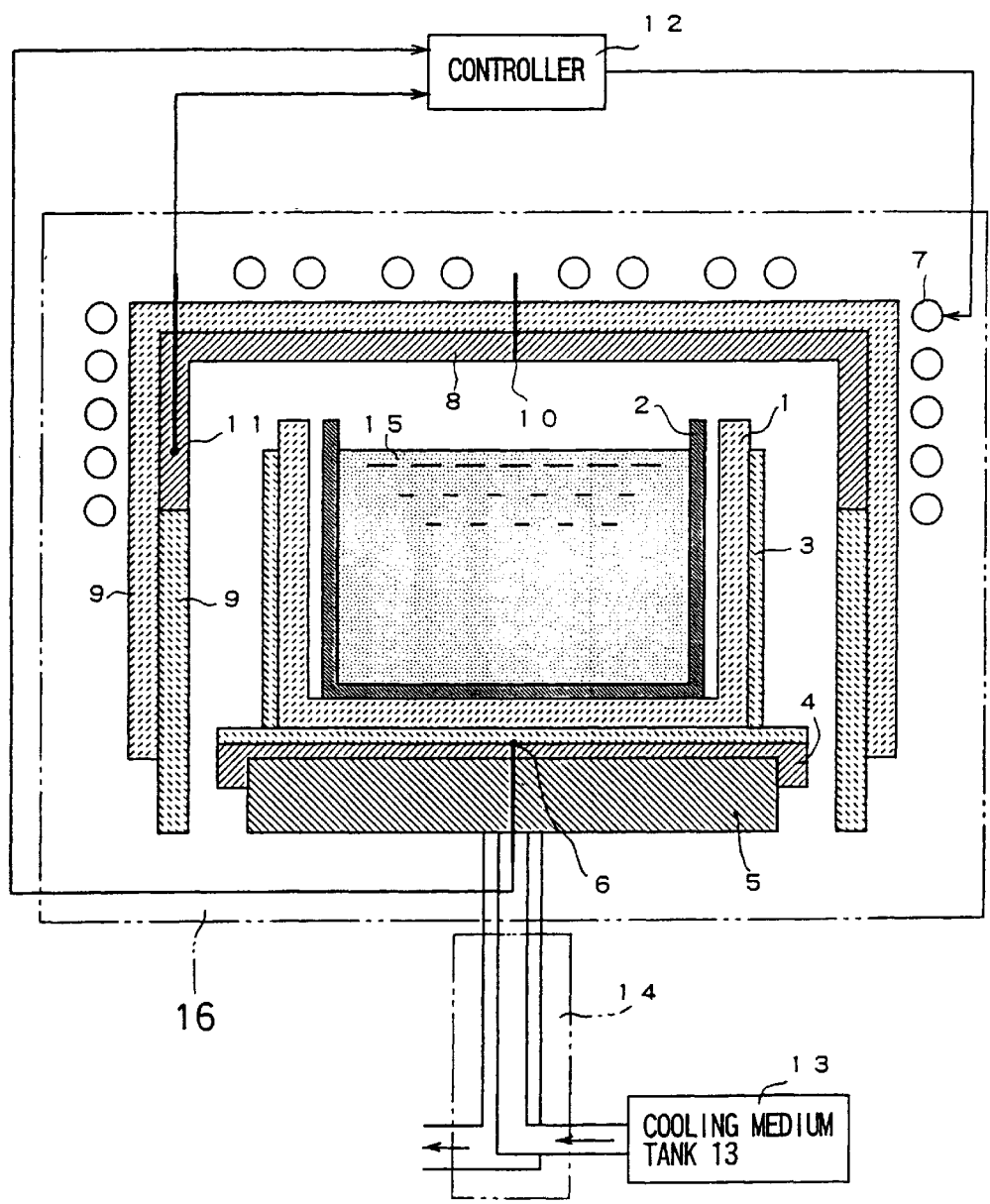
FIG. 1 is a simplified front sectional view schematically showing a configuration according to an embodiment of the invention.

Now referring to the drawings, preferred embodiments of the invention are described below.

FIG. 1 is a diagram schematically showing a configuration of a polycrystalline silicon ingot production apparatus according to an embodiment of the present invention. A crucible 1 is formed to be substantially circular or rectangular cylinder shape and is made of silica. Alternatively, the crucible is made of a refractory such as graphite, silicon nitride, boron nitride or a metal with high melting point such as tantalum, molybdenum or tungsten. An inner crucible 2 can be formed also of a metal with high melting point such as tantalum, molybdenum or tungsten. The inner crucible 2 is mounted on the outer crucible 1 so that the bottom of the inner crucible is on the bottom surface of the crucible 1, and a gap is formed between the outer peripheral surface of the inner crucible 2 and the inner peripheral surface of the outer crucible 1. The outer peripheral surface of the outer crucible 1 is covered with a cover 3 of graphite except for the top of the outer crucible 1. The bottom of the outer crucible 1 is mounted on a horizontal supporting bed 4. The supporting bed 4 is mounted on a pedestal 5 which can be displaced both in a radial direction and vertical direction. The temperature of the bottom surface of the outer crucible 1 is detected by a thermocouple 6.

An induction heating coil 7 is arranged above the top of the crucible 1 at a distance from the crucible 1. When a high-frequency current is supplied to the induction heating coil 7, a heating member 8 made of graphite or carbon fibers is heated inductively. The heating member 8 is located at a distance from the top of the crucible 1. When the heating member 8 is heated, the crucible 1 is heated from the top thereof by the radiation heat. A thermal insulating member 9 made of graphite or carbon fibers is arranged beneath and outside the heating member 8. A pyrometer 10 is attached so as to face the interior of the inner crucible 2 from the upper side of the inner crucible 2. The temperature of the heating member 8 is detected by a control thermocouple 11. The outputs of the thermocouple 6 and the control thermocouple 11 are input to a controller 12 whereby the heating condition by the induction heating coil 7 is controlled.

The pedestal 5 can be cooled by cooling water or the like supplied from a cooling medium tank 13. An alternative cooling medium may be used. The pedestal 5 is driven by driving means 14 so as to rotate about a vertical line passing through the center of the crucible 1 and to move up or down in the vertical direction. A silicon semiconductor material 15 having charged in the inner crucible 2 can be melted downwardly from the top to the bottom, by heating the inner crucible 2 from the upper side thereof by the induction heating coil 7. At this time, rotating of the pedestal 5 by driving means 14 will cause the silicon semiconductor material 15 in the inner crucible 2 to be uniformly heated and melted. When the pedestal 5 is cooled by the cooling water from the cooling medium tank 13, the silicon semiconductor material 15 in the inner crucible 2 starts solidifying at the bottom thereof. In the case where the pedestal 5 is moved down by the driving means 14 so as to relocate the heating member 8 away from the silicon semiconductor material 15 in the inner crucible 2, the unidirectional upward solidification from the bottom to the top of the inner crucible 2 can be promoted. For preventing the oxygen gas or nitrogen gas from entering the melting silicon semiconductor material 15, the whole apparatus is accommodated in an airtight vessel 16 so as to be sealed off from an exterior and inside the airtight vessel 16 is maintained under vacuum or inert environment by an inert gas or the like.

Figure 2:
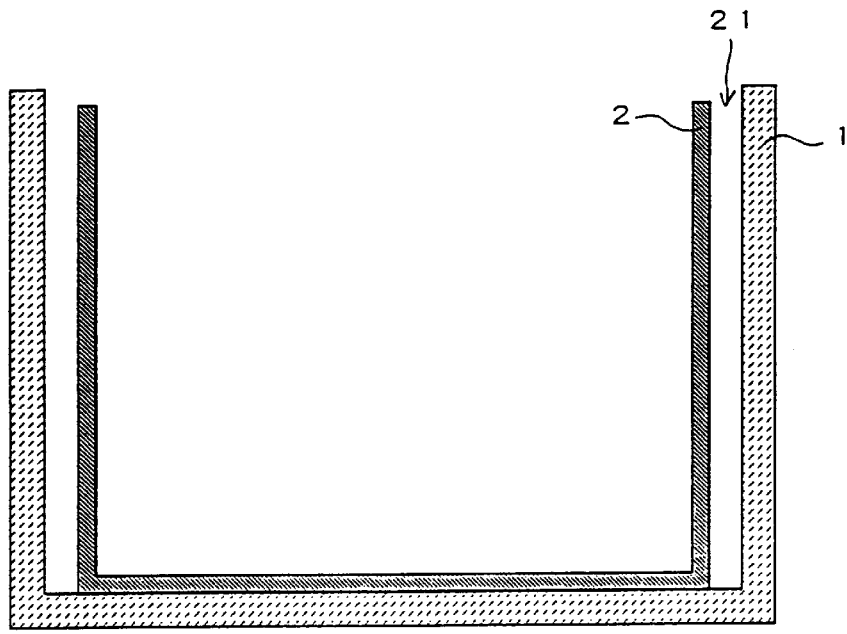
FIG. 2 is a simplified sectional view showing a double structure including an outer crucible 1 and an inner crucible 2 of FIG. 1.

FIG. 2 shows a double structure composed of the crucible 1 and the inner crucible 2 shown in FIG. 1. The silicon to be charged as a semiconductor material is about 140 kg per charge. An ingot to be produced has a bottom area of 55 cm square. As described above, the outer crucible 1 is made of silica (quartz), and the inner crucible 2 is made of a metal with high melting point such as tantalum. The inner crucible 2 is preferably made of a material of high heat resistance and of poor wettability with silicon. Molybdenum and tungsten have been confirmed to have a similar effect to tantalum.

A gap 21 is formed between the outer crucible 1 and the inner crucible 2. A preliminary test, which was conducted to produce a silicon ingot by changing the size of the gap 21 between 15 mm, 20 mm and 30 mm, shows that the gap 21 having an initial size of 15 mm or 20 mm disappears at the time of solidification of ingot to cause a strain in the outer crucible 1. Alternatively, the gap 21 having an initial size of 30 mm also disappears after all, but causes no strain in the outer crucible 1. This indicates that the gap 21 is required to be at least 30 mm in width.

Figure 3:
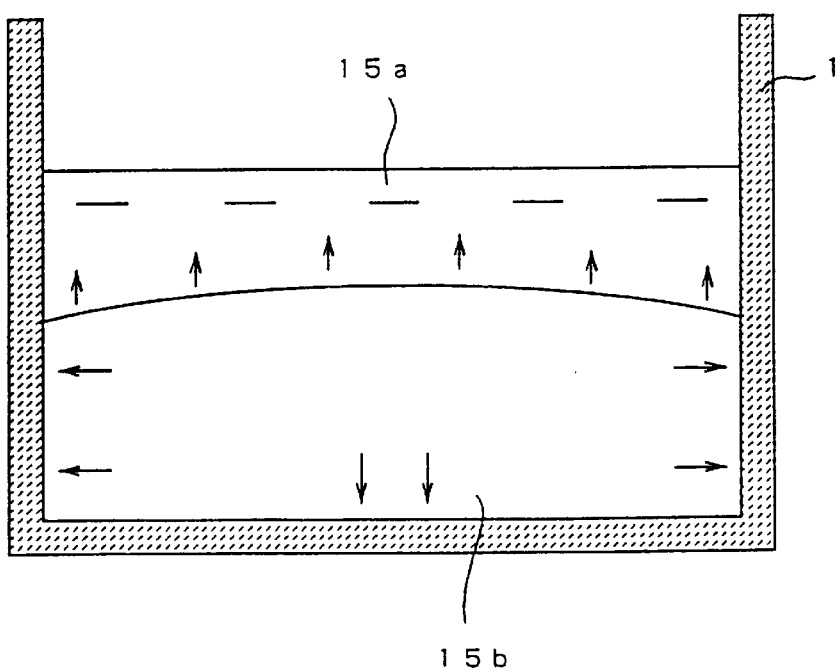
FIG. 3 is a simplified sectional view showing a manner in which a strain is generated by volume expansion of silicon when the silicon is directly solidified in the crucible 1 as in the conventional way.

FIG. 3 shows a strain caused by the volume expansion when silicon is solidified directly in the crucible 1. In the case where a melted fluid of silicon 15a is directly solidified for producing a silicon ingot 15b in the conventional crucible 1, the volume expansion of the silicon causes a strain due to the stress in the ingot 15b because the volume expansion of the silicon is restricted by the peripheral crucible 1. As shown in FIG. 2, by contrast, in the case where the inner crucible 2 is extendable together with the ingot, it is possible to release the stress thereby reducing the influence of the strain.

Figure 4:
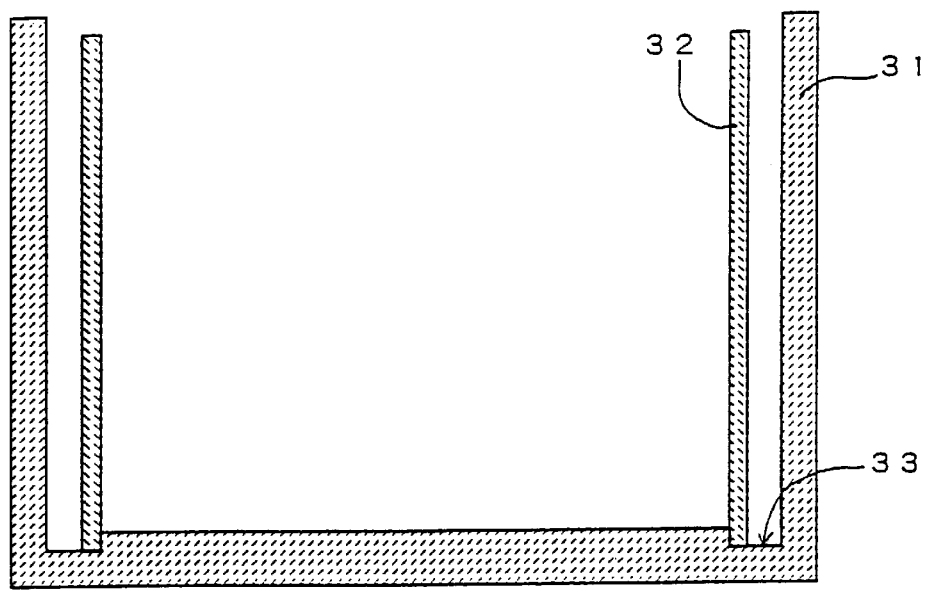
FIG. 4 is a sectional view schematically showing a configuration according to another embodiment of the invention.
Figure 5:
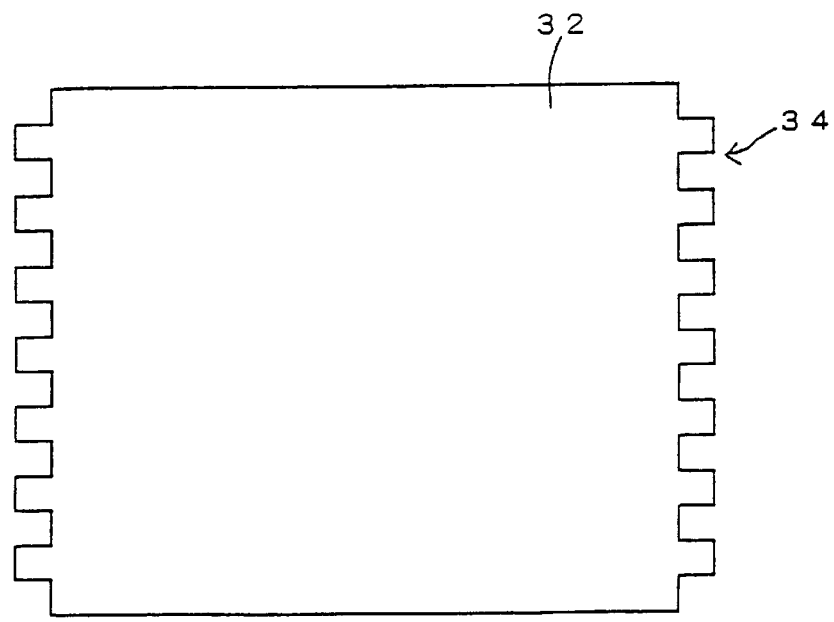
FIG. 5 is a front view of a partition 32 shown in FIG. 4.
Figure 6:
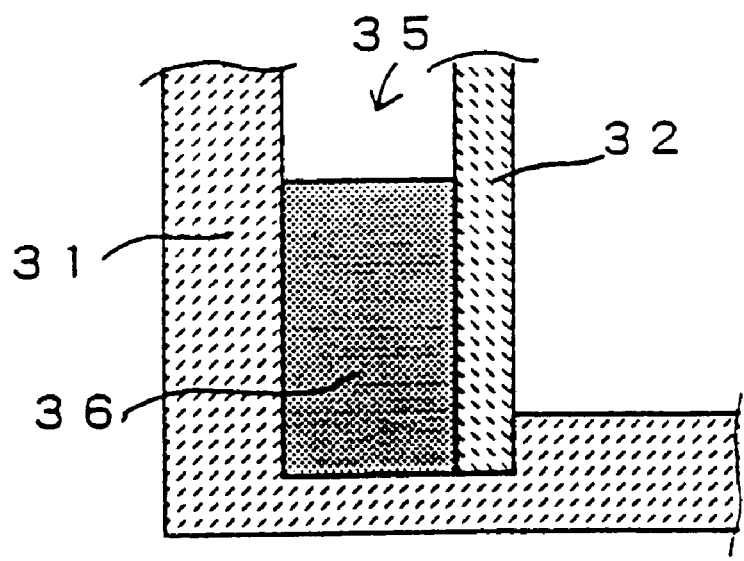
FIG. 6 is a simplified sectional view showing a state in which a granulated refractory 36 is charged as buffer means between a crucible 31 and the partitions 32 in FIG. 4.

FIG. 4 shows a polycrystalline silicon ingot production apparatus of slidable type according to another embodiment of the invention. A partition 32 made of silica which is movable in a radial direction of a crucible 31 is arranged inside the crucible 31. This partition 32 moves in accordance with a thermal expansion of the ingot at the time of solidification of the ingot, thereby relaxing the strain. A groove 33, which is formed in the bottom of the parallelopipedal crucible 31, permits four partitions 32 to be combined to each other. Each partition 32, as shown in FIG. 5, has hook-shaped protrusions 34 formed on its side. By combining adjacent partitions 32 by the protrusions 34, the space defined by four partitions 32 can expand while keeping the parallelopipedal shape of that space. The width of a gap 35 between the crucible 1 and the partition 32 in the state shown in FIG. 4 is set to be 30 mm as in FIG. 3. As shown in FIG. 6, the gap 35 is filled with a granulated refractory 36 such as sand or granular quartz up to half of the height of the partitions 32. As a result, the size of the bottom can be kept constant in the initial stages of solidification.

Figure 7A:
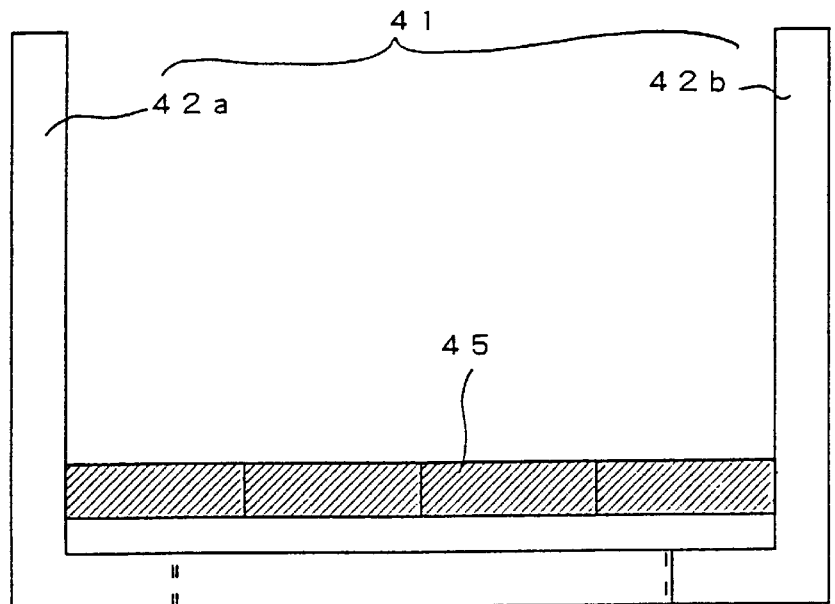
FIG. 7A is a front sectional view and FIG. 7B a plan view of a crucible according to still another embodiment of the invention.
Figure 7B:
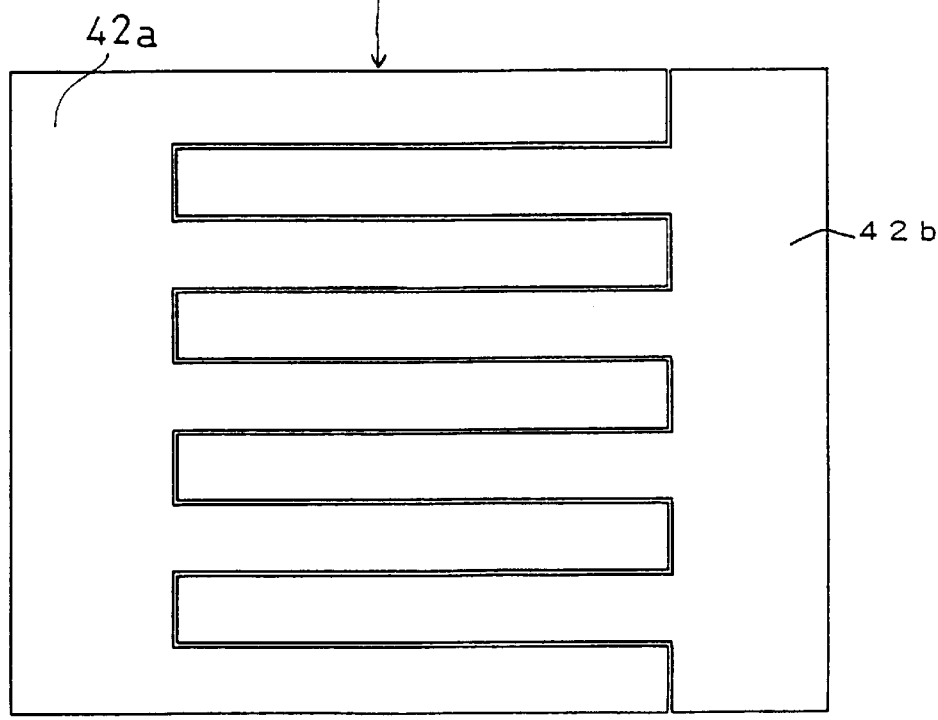

FIG. 7 shows a structure of a crucible 41 of dividable type according to still another embodiment of the invention. The crucible 41 is formed by combining two half crucibles 42a, 42b so that the two crucibles form a comb-shaped portion 43 at their bottoms. FIG. 7A shows a side sectional view of the crucible 41 in combined state, and FIG. 7B the comb-shaped portion 43 in combined state. By spreading seed crystals 45 all over the bottom of the crucible 41 as shown in FIG. 7A, the possibility of leakage of melted silicon is eliminated when the comb-shaped portion 43 slides in such a direction that the half crucibles 42a, 42b leave each other to enlarge the gap width. In addition, since the seed crystals 45 also function as an weight, materials such as carbon having specific gravities than silicon can be used as materials for the half crucibles 42a, 42b.

Figure 8:
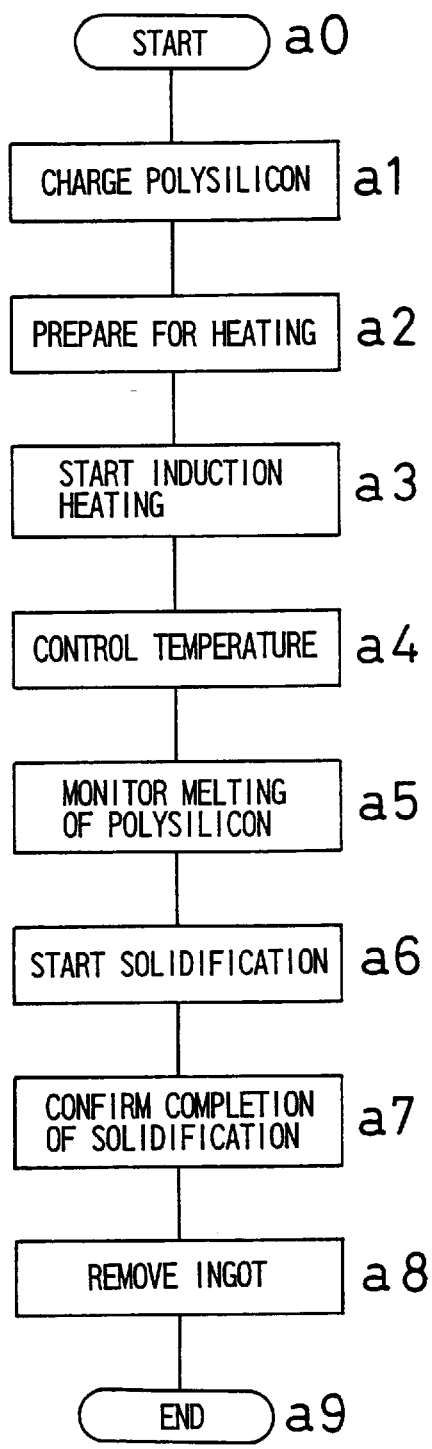
FIG. 8 is a flowchart showing steps of producing a polycrystalline silicon ingot according to the embodiment of FIG. 1.

According to the embodiment of FIG. 1, standard steps for producing a polycrystalline silicon ingot are shown in FIG. 8. The process starts with step a0, followed by step a1 in which the inner crucible 2 is charged with a polysilicon of about 140 kg. In this embodiment, the inner crucible 2 has the bottom of 55 cm square as described above, and the gap width between the inner crucible 2 and the outer crucible 1 is 30 mm. In step a2, the outer crucible 1 charged with the polysilicon is placed on the supporting bed 4, which in turn is mounted on the pedestal 5, and thereafter executing preparation for heating. The pedestal 5 is cooled by the cooling water supplied from the cooling medium tank 13.

In step a3, an alternating current of about 7 kHz in frequency is supplied to the induction heating coil 7 to start the induction heating process for increasing the temperature of the heating member 8. The outer crucible 1 and the polysilicon are heated by the heat radiated from the heating member 8. When the temperature reaches about 1,420° C. which is the melting point of silicon, the polysilicon proceeds to melt downwardly. In this embodiment, since the heating means is arranged above the crucible 1 and the cooling means under the crucible 1, the polysilicon proceeds to melt downwardly. In step a4, the electric power to be supplied to the induction heating coil 7 is controlled for keeping the furnace temperature at constant. In step a5, melting of the polysilicon and the temperature change of the thermocouple 6 are monitored by the pyrometer 10, followed by step a6 for gradually decreasing the internal temperature of the inner crucible 2 while at the same time lowering the pedestal 5 to start solidification. The pyrometer 10 detects not only the radiation temperature of the polysilicon surface but also change in emissivity between a liquid phase and a solid phase. The cooling rate is 1° C./h, for example. The pedestal 5 is lowered at a rate of 10 mm/h. During the solidification, the supporting bed is rotated at a rate of 1 rpm in order to alleviate the effect of the temperature distribution. Step a7 judges whether the solidification has completed or not based on the change in the output of a heating oscillator or the like. Upon completion of the solidification, a cooling process is started in step a8, and upon completion of the cooling process, an ingot thus produced is removed. The whole process is completed in step a9.

Figure 9:
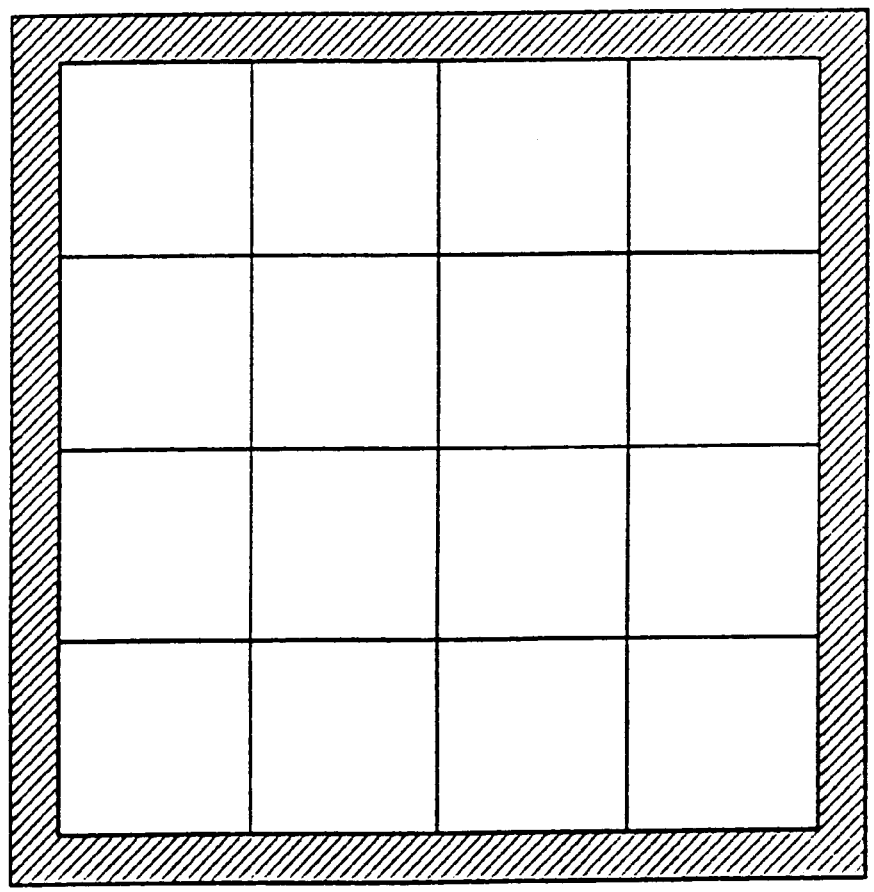
FIG. 9 is a diagram showing a manner by which 16 blocks are cut out of a silicon ingot produced according to the embodiment of FIG. 1.
Figure 10B:
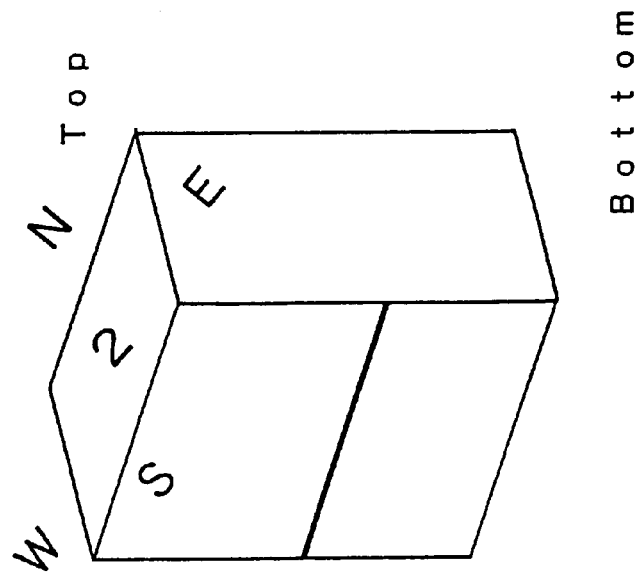
FIG. 10A is a simplified plan view showing a state in which the 16 blocks cut out as shown in FIG. 9 are assigned serial numbers, and FIG. 10B a perspective view showing a point where the life time of the second block is measured.
Figure 10A:
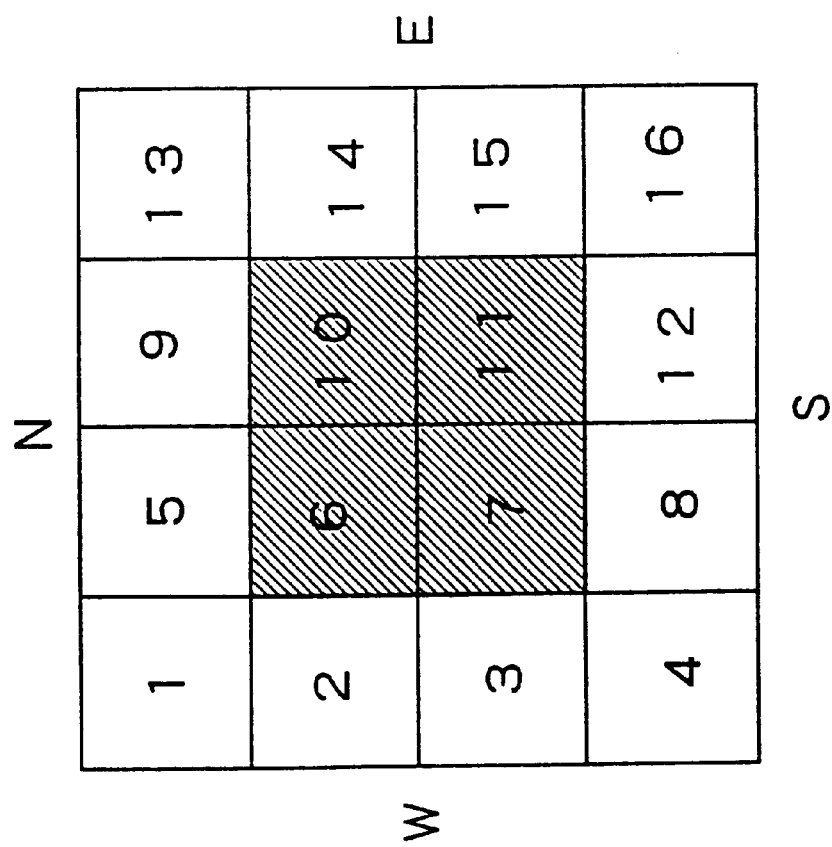

FIG. 9 shows a manner in which an ingot is cut into 16 blocks having a section of 125 mm square. The purpose of the cutting process is to obtain four equidistant cutting margins on the four sides. FIG. 10A shows 16 blocks with the cutting margins being removed. Assume that each block has the sides N, W, S, E. FIG. 10B shows a point at which a life time is determined for the second block of FIG. 10A, located at 100 mm from the bottom on the S surface. The life time value for the prior art in which the relaxation against the expansion is not taken into consideration is 5 to 7 $\mu$s. According to this invention, however, the life time value of the blocks is increased to as high as 10 to 15 $\mu$s. Comparison at the hatched center blocks in FIG. 10A shows that the value of 10 to 15 $\mu$s is obtained for both the prior art and the present invention.

A similar effect is obtained with a crucible of slidable type or divisible type, as well as with the double-structured crucible according to the above embodiment. The invention is applicable with equal effect to a raw semiconductor material other than silicon.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A process for producing a polycrystalline semiconductor ingot comprising the steps of:
    charging a raw semiconductor material which will expand at the time of being solidified, into a crucible; and
    heating a top of the crucible while cooling a bottom of the same, thereby allowing the raw semiconductor material to be solidified uni-directionally from a lower part to an upper part thereof within the crucible,
    wherein the crucible used is capable of relaxing a strain caused by an expansion of the raw semiconductor material at the time of solidification;
    wherein the crucible is formed to be a double-structured crucible in which a space is provided between an inner crucible and an outer crucible, and the inner crucible extends in accordance with the expansion of the semiconductor so as to relax the strain in the semiconductor.

2. The process for producing a polycrystalline semiconductor ingot comprising the steps of:
    charging a raw semiconductor material which will expand at the time of being solidified, into a crucible; and
    heating a top of the crucible while cooling a bottom of the same, thereby allowing the raw semiconductor material to be solidified uni-directionally from a lower part to an upper part thereof within the crucible,
    wherein the crucible used is capable of relaxing a strain caused by an expansion of the raw semiconductor material at the time of solidification; and
    wherein a partition is provided inside a peripheral wall of the crucible, and the partition is arranged to be movable outwardly.

3. The process for producing a polycrystalline semiconductor ingot comprising the steps of:
    charging a raw semiconductor material which will expand at the time of being solidified, into a crucible; and
    heating a top of the crucible while cooling a bottom of the same, thereby allowing the raw semiconductor material to be solidified uni-directionally from a lower part to an upper part thereof within the crucible, wherein the crucible used is capable of relaxing a strain caused by an expansion of the raw semiconductor material at the time of solidification; and wherein the crucible can be divided into a plurality of portions, and the portions of the crucible are combined with each other in a form of comb at the bottom of the crucible so as to be slidably displaced outwardly in a comb tooth direction of the crucible.

4. The process for producing a polycrystalline semiconductor ingot of claim 1 further comprising a step of placing semiconductor seed crystals on the bottom of the crucible before charging the raw semiconductor material, wherein a polycrystal is grown from the seed crystals.

5. The process for producing a polycrystalline semiconductor ingot of claim 4, wherein the raw semiconductor material is a polysilicon.

* * * * *